US008546859B2

(12) United States Patent
Maes et al.

(10) Patent No.: US 8,546,859 B2
(45) Date of Patent: Oct. 1, 2013

(54) SEMICONDUCTOR DEVICE WITH A CMOS IMAGE SENSOR AND METHOD OF MANUFACTURING SUCH A DEVICE

(75) Inventors: Willem Hendrik Maes, Lommel (BE); Alouisius Wilhelmus Marinus Korthout, JP Drunen (NL)

(73) Assignee: Teledyne Dalsa B.V., Thousand Oaks, CA (US)

( * ) Notice: Subject to any disclaimer, the term of this patent is extended or adjusted under 35 U.S.C. 154(b) by 1153 days.

(21) Appl. No.: 11/505,988

(22) Filed: Aug. 18, 2006

(65) Prior Publication Data
US 2008/0042231 A1 Feb. 21, 2008

(51) Int. Cl.
*H01L 27/146* (2006.01)

(52) U.S. Cl.
USPC ............. 257/292; 257/462; 257/E27.133

(58) Field of Classification Search
USPC ................................. 257/291, 292
See application file for complete search history.

(56) References Cited

U.S. PATENT DOCUMENTS

| | | | |
|---|---|---|---|
| 5,900,623 A | 5/1999 | Tsang | |
| 5,981,932 A | 11/1999 | Guerrieri | |
| 6,566,697 B1 | 5/2003 | Fox | |
| 6,727,946 B1 * | 4/2004 | Zhao et al. | 348/308 |
| 6,911,640 B1 * | 6/2005 | Bencuya et al. | 250/208.1 |
| 7,286,174 B1 * | 10/2007 | Weale et al. | 348/308 |
| 2003/0151050 A1 | 8/2003 | Fox | |
| 2003/0227018 A1 | 12/2003 | Fox | |
| 2005/0001148 A1 | 1/2005 | Watanabe | |
| 2005/0017245 A1 * | 1/2005 | Manabe et al. | 257/72 |
| 2006/0071254 A1 * | 4/2006 | Rhodes | 257/292 |

* cited by examiner

*Primary Examiner* — Matthew W Such
*Assistant Examiner* — Abul Kalam
(74) *Attorney, Agent, or Firm* — Eric A. Gifford

(57) ABSTRACT

The invention relates to a semiconductor device with a semiconductor body comprising a CMOS image sensor with a plurality of active pixels arranged in rows and columns each pixel comprising a pinned photodiode and a plurality of transistors for operating the pixel in the image forming process and including reset means.

According to the invention the semiconductor device comprises also precharge means by which the photodiode can be precharged by a fixed amount of charge carriers after it has been reset by the reset means. In this way the sensors has a highly linear response, in particular at low light/radiation level, and a very low noise. The sensor is very suitable for X-ray/medical applications.

15 Claims, 3 Drawing Sheets

SEMICONDUCTOR DEVICE WITH A CMOS IMAGE SENSOR AND METHOD OF MANUFACTURING SUCH A DEVICE

BACKGROUND OF THE INVENTION

The invention relates to a semiconductor device comprising a CMOS image sensor as being recited in the preamble of claim 1. It is to be noted that in this application C-MOS image sensor means that the sensor is based on CMOS (=Complimentary Metal Oxide Semiconductor) technology or on NMOS technology or on PMOS technology. In CMOS technology both NMOS and PMOS technology is used.

Such sensors have been in use for imaging transmission patterns from ionizing radiation, that without limitation are used in medical diagnostics. A high charge capacity and a low noise are essential for such a sensor in general but in particular for said application. Prior art, in particular US Patent Application US 2005/0017245 to Manabe et al. that has been published on Jan. 27, 2005 uses CMOS image sensor having a so-called 4T pixel which means that it comprises a photodiode and four transistors, in this case a transfer transistor, a source follower transistor, a reset transistor, and a select transistor. The photodiode is pinned. That means that its structure is such that at a certain voltage, the so-called pin voltage (Vpin), the surface potential of the np-diode (i.e. the upper pn junction) is "pinned" to the p-well or p-substrate through the presence of a (thin) p+ region above the np-diode. Both the surface state shielding by pinning the photodiode and the low maximum electrical field in such a photodiode with two junctions (pnp structure) results in a low leakage current and low shot-noise. Such a device also has a very low reset noise provided that the diode is completely depleted after reset.

On the other hand, such a device has the disadvantage that its photodiode does not have a very high charge capacity. This is mainly related to the capacity limitation of the sense node in such a 4T configuration. Moreover, also the relatively large number of transistors, i.e. 4 pro pixel, requires more surface area and contributes to some extend to a lower charge capacity of the known device. In particular for the envisaged medical application of X-ray imaging, a high charge capacity for each pixel is very desirable. Furthermore in a 4T configuration a so-called nondestructive readout is not possible since the detected charge is necessarily transferred from the photodiode to a sense node and thus is lost for further detection. The present inventors have recognized that these disadvantages can be overcome in a manner implying that also the noise is low and a linear response is obtained.

SUMMARY TO THE INVENTION

In consequence, amongst other things, it is an object of the present invention to provide a CMOS image sensor that shows a highly linear response and has a low noise.

Now therefore, according to one of its aspects, the semiconductor device according to the invention is characterized according to the characterizing part of claim 1. Such charge can be introduced in various manners. A preferred way to introduce said precharge is to position a preset gate close to the photodiode. Such a preset gate can be provided with charge on a suitable moment by collecting a fixed charge from the photodiode in a special reset state. At another suitable moment said preset gate can be triggered by changing the gate voltage to discharge its charge to the photodiode in order to precharge the latter before the start of obtaining a signal in the pixel, i.e. the imaging and integration stage. The value of the predetermined pre-charge below the preset gate can be varied in a simple and effective manner by adjusting the preset gate voltage.

The invention is based on the following recognitions. Firstly, that the use of such a preset gate enables the use of a 3T (=three transistor) without introducing other disadvantages like a high noise or non-linearity. By using a 3T configuration for a pixel the charge capacity is considerably increased. Moreover, such a 3T architecture is a suitable non-destructive read-out since in such a structure the read-out is directly from the photodiode and the collected charge thus remains available for further processing.

Furthermore, the invention is based on the recognition that a non linear response at low light/radiation condition that may be occur can be avoided if the last steep part of a CV (=Capacitance Voltage) curve of the photodiode towards the minimum capacitance can be avoided. The inventors further have realized that on the one hand said steep part of the CV curve can be avoided by introducing a fixed and predetermined charge package into the photodiode after full reset. In this way, the region of the CV curve corresponding with the non-linear response is avoided. On the other hand, said introduction can be done in a manner introducing relatively little noise. The latter can be illustrated as follows. The (minimal) reset capacitance of the photodiode Creset can be as low as 1.7 fF. A preset gate will introduce a capacitance Cpreset of about 4 fF. The noise associated herewith can be obtained from: Noise=SQRT(kT(Creset+Cpreset)/Q which is about 30 $e^-$. A photodiode, of a normal 3T pixel sensor device, has a capacitance C of about 60 fF, which implies that the noise is about $100e^-$. This is considerably higher. Remark: the numbers above form an example. It is not specific to this invention. Thus, in summary the present invention allows for the use of a 3T pixel structure with the advantages of a high-charge capacity and a non-destructive read-out while at the same time a linear response, in particular at low light/radiation level, and low noise, in particular associated with the reset, are obtained.

The doping concentration and the thickness of the charge-collecting region of the photodiode, i.e. the n-type region in case of a pnp photodiode, are chosen such that the charge capacity is maximum and the pin voltage (Vpin) is about equal to the reset voltage (Vreset). In this way, on the one hand the sensitivity of the image sensor is maximal and on the other hand the advantages of the pinning are available up to and during reset. Said collecting region is preferably formed by implantation, e.g. an implantation of n-type impurities into a p-type substrate. Dose and energy of said implantation are to be selected according to the above criteria. The surface $p^+$ region is preferably formed by a shallow implantation.

In a preferred embodiment a device according to the invention comprises three transistors. Such a 3T (=three transistors) pixel has among others the advantage that it enables a very high charge capacity of the photodiode. This is particularly desirable for the envisaged application.

Preferably the amount of pre-charge carriers is such that it corresponds with the integral in the capacitance-voltage characteristic of the photodiode from a voltage after reset at which the capacitance is substantially zero to a voltage substantially equal to the reference voltage and with a non-zero capacitance lying just before the onset of non-linearity in said capacitance-voltage characteristic.

The invention also comprises a method of manufacturing a semiconductor device as described in claim 10.

BRIEF DESCRIPTION OF THE DRAWING

These and further features, aspects and advantages of the invention will be discussed more in detail hereinafter with reference to the disclosure of a preferred embodiment of the invention, and in particular with reference to the appended Figures that illustrate.

DETAILED DESCRIPTION OF PREFERRED EMBODIMENTS

Figure 1:
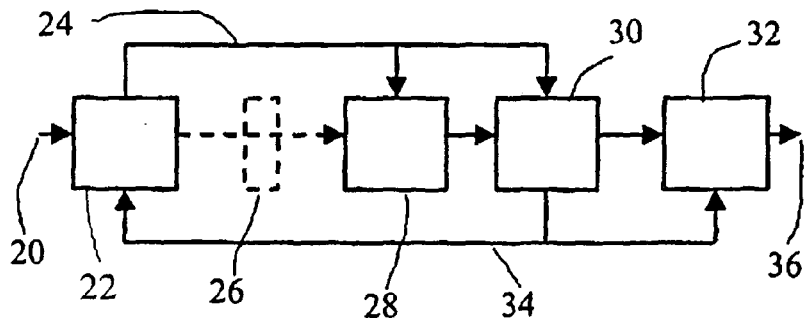
FIG. 1, an overall arrangement of a preferred apparatus of which the invention forms part.

FIG. 1 illustrates an overall embodiment of an apparatus in which a semiconductor device according to the present invention may be applied. Herein, a source 22 of irradiation, such as X-ray, is made to temporarily irradiate an object 26, such as a human person or a part thereof. The purpose of irradiation can be diagnostic, which will be considered to be the case here. In principal, other purposes are feasible, such as recognized by persons skilled in the art. The transmission pattern of the radiation (X-rays being first converted to photons) is measured by a C-MOS array 28, and upon termination of the irradiation period, read out for use by a radiologist or other.

Now, the operation is started by a start command on control terminal 20. At this instant, a reset command will be given to measuring CMOS array 28 and to the combining or arithmetic means 30. Furthermore, the irradiation of object 26 will commence, and the irradiation will lead to charge accumulation in the cells of CMOS array 28. A subset of multiple distributed C-MOS cells across the array may be targeted for contributing to a dose measurement. This contribution is effected by repeated non-destructive readout thereof to arithmetic means 30. The readout of array 28 is effected in relatively brief intervals wherein the irradiation can be paused if necessary. If necessary, a certain calibration factor can be applied for converting the reading acquired to an actual dose figure. Now, if the right dose has been attained, a termination signal can appear on line 34. On the one hand, this will signal irradiation facility 22 to stop more or less immediately. On the other hand, this will signal evaluation device 32 to read out all CMOS for outputting the measured transmission image on line 36 for further usage.

It is to be noted that a device according to the present invention can be applied however in another apparatus used in or suitable for medical X-ray applications. In fact, the device according to the present invention can also be applied advantageously outside the field of (medical) X-ray applications.

Figure 2:
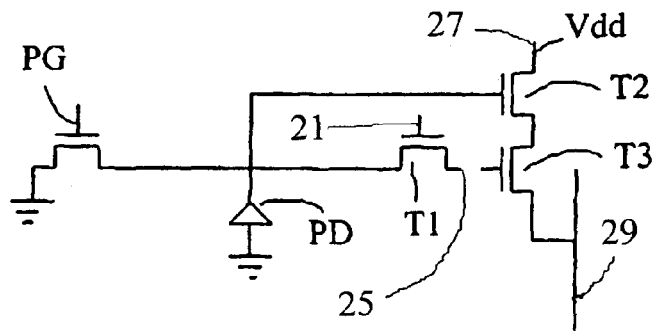
FIG. 2, a circuit arrangement of a pixel of a device of the embodiment.

FIG. 2 illustrates a circuit arrangement of a pixel of a device of a preferred embodiment of a semiconductor device according to the invention. The circuit is a so-called 3T circuit which has been extended with a preset gate PG. It contains, apart from the photodiode PD and said preset gate PG not more than three transistors T1,T2,T3. At the beginning of a read cycle, a pulse is applied on the gate 21 of the reset transistor T1 to set the photodiode PD on a fixed reference voltage (Vref, at node 25) derived from the voltage on node 27. The integration starts when the reset pulse is disabled. Furthermore, the preset gate PG functions as a capacitance for a preset charge. At a suitable stage during reset said preset charge can be deducted from the charge in the photodiode PD. At another suitable moment during reset, said well determined charge below the preset gate PG will be brought into the photodiode PD. For more detail in this respect, we refer here to FIG. 7 and the corresponding part of the description. The photo-diode PD is exposed to light and discharges the node voltage at a given rate depending on the light intensity and the integration time. A source follower T2 buffers the node voltage on the photo-diode. The gate voltage on this source follower T2 is copied to the source of the transistor T2. With the select transistor T3, the signal of the source follower T2 is dumped on the column 29 where it is amplified and send to the data path for further data processing.

Figure 3:
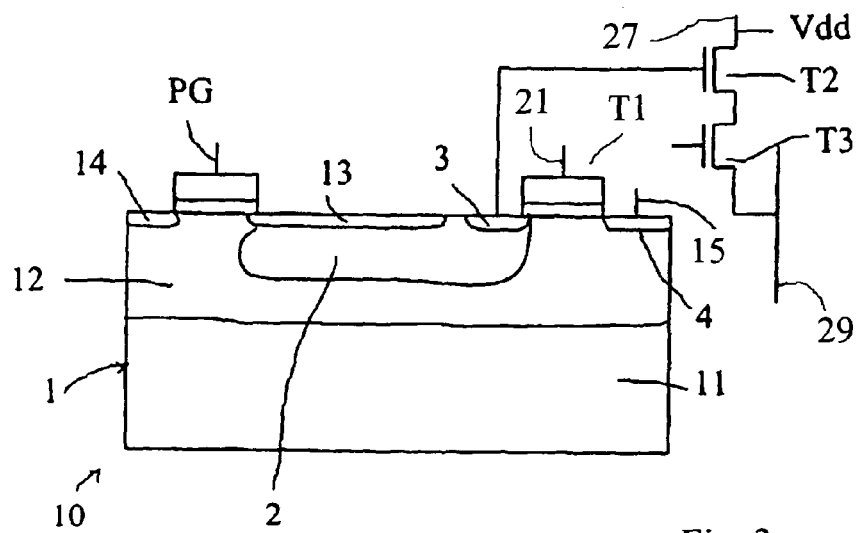
FIG. 3, a relevant part of the semiconductor body comprising the photodiode.

FIG. 3 illustrates in particular a relevant part of the semiconductor body comprising the photodiode. The semiconductor device 10 comprises a semiconductor body 1 with a substrate 11, in this example a p-type substrate with a doping concentration of about $10^{18}$ at/cm$^3$. On top thereof a p-type epitaxial layer 12 is present with a doping concentration of about $10^{15}$ at/cm$^3$. In the latter, an n-type charge collecting region 2 of the photodiode PD is formed, here by ion implantation. In this example dose and energy for said phosphor implantation are $1.5 \times 10^{12}$ at/cm$^2$ and 180 keV respectively. Above said region 2, a shallow p$^+$ region 13 is formed also by ion implantation, thus completing the pnp structure of the pinned photodiode PD. The charge collecting/radiation sensitive region 2 is provided with a contact region 3. On top of the surface of the semiconductor body 1 a p$^+$ region 14 is present bordering the preset gate structure PG surrounded by spacers and on top of a gate dielectric and which is positioned close to the photodiode PD. Also present is reset gate structure RG which is positioned between the contact region 3 of the photodiode PD and a sunken n-type region 4 on which the reset voltage is available.

Figure 4:
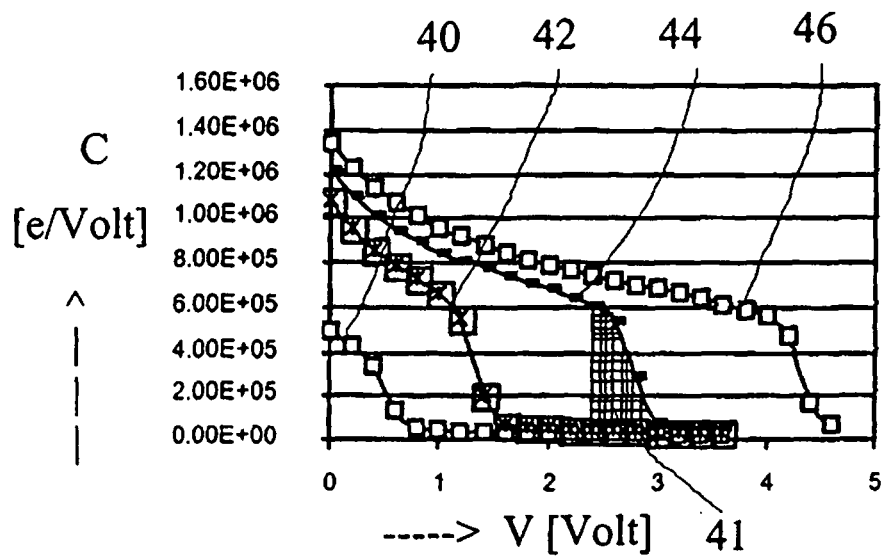
FIG. 4, the effect of the doping concentration in the photodiode.

FIG. 4 illustrates the effect of the doping concentration in the photodiode. Curves 40,42,44,46 are CV (=Capacitance Voltage) curves of a photodiode PD. Plotted is the capacitance C in electron/Volt as a function of the Voltage for various energy/dose values for the ion implantation by which the n-type region 2 of the photodiode PD is formed. The implantation energy was always 180 keV. The fluxes are $7 \times 10^{11}$ at/cm$^2$ for curve 40, $1 \times 10^{12}$ at/cm$^2$ for curve 42, $1.5 \times 10^{12}$ at/cm$^2$ for curve 44 and $2 \times 10^{12}$ at/cm$^2$ for curve 46. The integral of each curve represents the total charge that can be collected for each photodiode PD in question. Obviously curve 46 corresponds with a maximum. However, the requirement that both reset voltage Vreset and pin voltage Vpin are around 2.5 to 3 Volt implies that for this example curve 44 represents the optimal situation. The cross-hedged area 41 below this curve between about 2.5 and 3.0 Volt corresponds with the total charge Q that is to be used for precharging the photodiode after complete reset at 3 Volt. In this way, a non-linear response of the photodiode PD at low light/radiation level condition is effectively and in a simple way avoided since integration is started after the charge injection by the preset gate. Said preset charge Q can be adjusted by adjusting the voltage Vpg on the preset gate PG. It is to be noted here that for Vpg is preferably selected as high as possible. Thus for a given precharge desired, the area of the preset gate is accordingly preferably selected to be minimal, this in view of obtaining a low capacitance.

Figure 5:
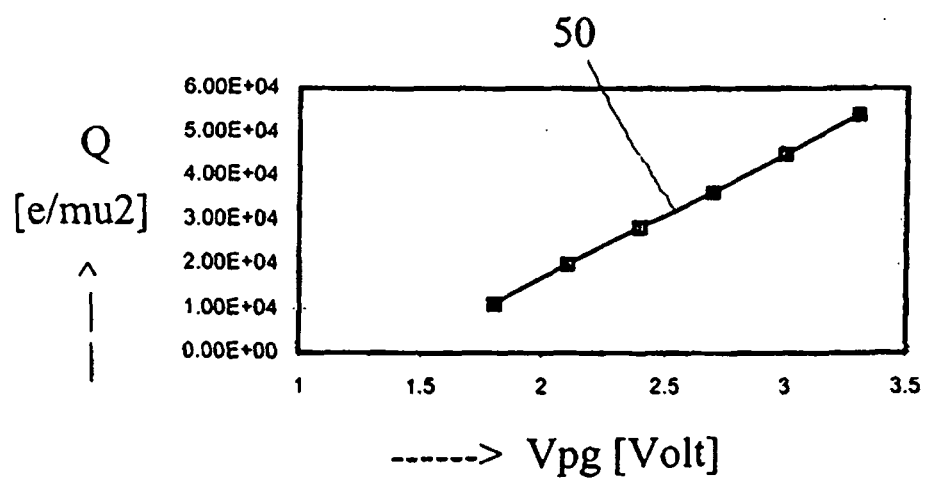
FIG. 5, the size of the precharge in function of the preset gate voltage Vpg.

FIG. 5 shows the size of the precharge charge Q in function of the preset gate voltage Vpg and the photo-diode at zero volt. As expected for a capacitance, curve 50 demonstrates an almost linear relation between Q and Vpg.

Figure 6:
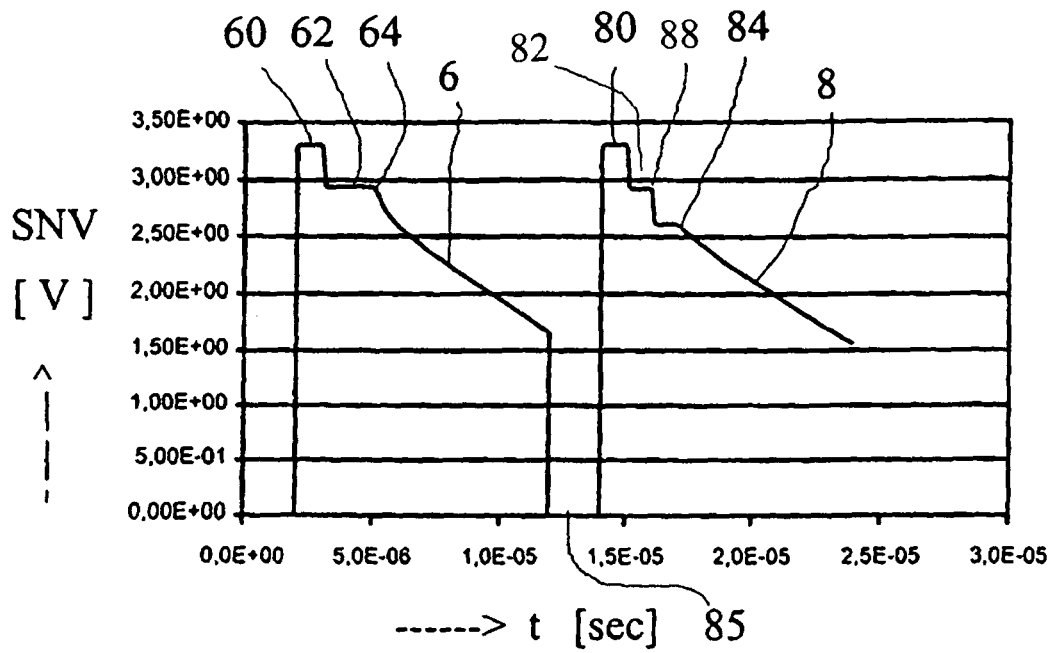
FIG. 6, the effect of the precharge on the response of the photodiode

FIG. 6 illustrates the effect of the precharge on the response of the exposed photodiode. Curves 6,8 show the response SNV (=Sense Node Voltage) as a function of the time t respectively for a semiconductor device without and with the present invention incorporated. Region 60 corresponds with reset of the photodiode. Region 62 corresponds with the situation where the reset transistor is turned off. At point 64 of curve 6, the integration starts. The non-linear part of curve 6 immediately after point 64 shows that a photodiode without the invention has a non-linear response at low light/radiation level.

This is quite contrary to the situation of curve 8 which corresponds with the response of a photodiode PD in a device according to the invention. At point 85 the preset gate PG is charged. Region 80 relates (as period 60) with the reset of the photodiode. Region 82 corresponds with region 62. Now, according to the invention, at point 88 a precharge Q that corresponds with charge 41 in FIG. 4 is injected into the photodiode resulting in a second voltage drop. The integration starts at point 84 and curve 8 of FIG. 6 shows that as of that point 84, the response is perfectly linear, including at the beginning, which corresponds with a low light/radiation level situation. Thus, in a device according to the invention, a non-linearity in the response of the photodiode PD can be completely avoided, while at the same a low reset noise is obtained. These are in practice important advantages.

Figure 7:
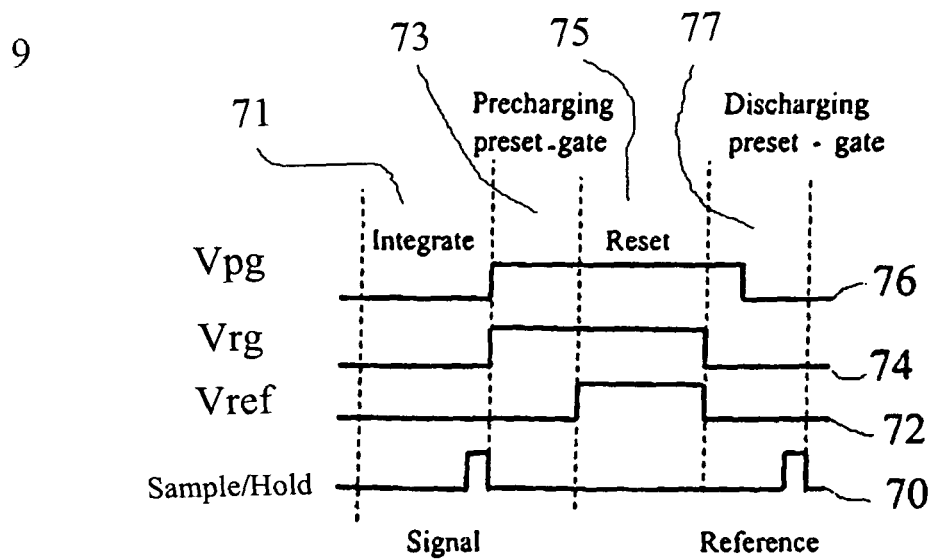
FIG. 7, a time-diagram of the various operations.

FIG. 7, shows a time-diagram of the various operations. Curves 70, 72, 74 and 76 show in a qualitative manner the values of Sample/Hold, Vref, Vrg (=the gate voltage of the reset transistor) and Vpg (=the gate voltage of the preset gate) in time. The timing diagram from FIG. 7 shows the control sequence for the pixel in a device according to the invention. It starts with the end of the (previous) integrate period 71. At the end of this integrate period 71, the signal is sampled as indicated in the Sample/Hold sequence 70. After reading the signal, the photo-diode is set at zero volt as indicated in sequence 72. This setting is done by activating the gate of the reset transistor (see sequence 74) which imposes the Vref voltage on the photo-diode. At this interval 73, also the Vpg gate voltage is active (see sequence 76), attracting electrons from the photo-diode to the preset gate. Next, during the 'reset' period 75, the reference voltage is put to high, emptying the photo-diode well. When the well is emptied and the Vreset is put off again, the Vpg signal is put low again during the 'discharging preset gate' period 77 as shown in sequence 76, injecting the stored electrons under the preset gate into the empty photo-diode well. The resulting voltage of the photo-diode is sampled as being the reference voltage (Vref) at the end of period 77.

Thus the net signal voltage, corresponding with the total amount of charge created by the photons impinging on the photodiode, is the difference between the signal sampled during the integrate period and the reference voltage.

The difference between the above control scheme and a 'normal' 3T pixel operation mode is besides the addition of a preset gate, also that the photo-diode is put to about zero volt, or at least to a low voltage, intermediate before doing the real 'reset' operation to a high Vref voltage.

Another essential difference with a "normal" 3T pixel device is, apart from the fact that it is pinned by the use of a thin surface p+ region, that the doping concentration and thickness of the charge collecting region of the photodiode are chosen such that the charge capacity is maximal and the pin voltage (=Vpin, the voltage with complete depletion) is about equal to the reset voltage (Vreset).

Now, the present invention has hereabove been disclosed with reference to preferred embodiments thereof. Persons skilled in the art will recognize that numerous modifications and changes may be made thereto without exceeding the scope of the appended Claims. In consequence, the embodiments should be considered as being illustrative, and no restriction should be construed from those embodiments, other than as have been recited in the Claims.

As an example it is noted here that the precharge means are not limited to a preset gate. Although the latter is a very much preferred, other preset means than a capacitance like a preset gate are feasible. For an example the amount of preset charge could be delivered by a current source during a well-determined time interval. The latter could be determined using a clock.

The invention claimed is:

1. A semiconductor device with a semiconductor body comprising a CMOS image sensor with a plurality of active pixels arranged in rows and columns, each pixel comprising a pinned photodiode and a plurality of transistors for operating the pixel in the image forming process and including reset means, said device being characterized in that the device comprises precharge means by which the photodiode can be precharged by a fixed amount of charge carriers after it has been reset by the reset means, wherein the precharge means comprises a preset gate positioned close to the photodiode which is triggered by a gate voltage change to discharge its charge by which the photodiode is precharged.

2. A semiconductor device as claimed in claim 1, wherein the preset gate can be charged by collecting the amount of charge carriers from the photodiode during reset.

3. A semiconductor device as claimed in claim 1, wherein the amount of charge carriers is adjustable by an adjustable preset gate voltage.

4. A semiconductor device comprised of a semiconductor body, the semiconductor body being comprised of a CMOS image sensor, the CMOS image sensor comprising a plurality of active pixels arranged in rows and columns, each pixel comprising a pinned photodiode and a total of three transistors for operating the pixel in the image forming process, wherein:
   the total of three transistors comprises reset means; and
   the device further comprises precharge means operable to precharge the pinned photodiode by a fixed amount of charge carriers after it has been reset by the reset means, wherein the precharge means comprises a preset gate positioned close to the photodiode which is triggered by a gate voltage change to discharge its charge by which the photodiode is precharged.

5. A semiconductor device comprising a CMOS image sensor with a plurality of active pixels arranged in rows and columns, each pixel comprising a photodiode, a reset transistor and a preset gate, wherein the CMOS image sensor further comprises:
   reset means for operating the reset transistor in each pixel to pass charge between a predetermined fixed reference voltage and the photodiode so that a voltage on the photodiode is reset to the predetermined fixed reference voltage at a beginning of a current read cycle; and
   preset means for operating the preset gate in each pixel (1) to transfer a predetermined preset charge from charge stored in the respective photodiode into a well beneath a gate electrode of the respective preset gate while the reset transistor is operated to reset the voltage on the photodiode in the current read cycle, and (2) to transfer the predetermined preset charge from the well beneath the gate electrode into the photodiode after the reset transistor is operated to reset the voltage on the photodiode in the current read cycle.

6. A semiconductor device according to claim 5, wherein each pixel includes exactly two transistors in addition to the reset transistor and the preset gate.

7. A semiconductor device according to claim 5, wherein the preset gate is operable to define the predetermined preset charge according to a preset gate voltage applied to the gate electrode of the preset gate in each pixel.

8. A semiconductor device according to claim 5, wherein:
a doping concentration of a charge collecting region of each photodiode defines a predetermined capacitance-voltage characteristic of the photodiode;
an integral of the predetermined capacitance-voltage characteristic from a start voltage to a finish voltage defines the predetermined preset charge in each pixel;
the start voltage is a voltage on the photodiode after the reset transistor is operated to reset the voltage on the photodiode in the current read cycle at which a capacitance of the photodiode is substantially zero; and
the finish voltage is a voltage on the photodiode slightly offset from the predetermined fixed reference voltage but at which the capacitance of the photodiode is non-zero and lies on the predetermined capacitance-voltage characteristic just before onset of a non-linearity region.

9. A semiconductor device according to claim 5, wherein:
a charge collecting region of each photodiode is characterized by a first conductivity type; and
each photodiode includes a thin surface region characterized by a second conductivity type that is opposite the first conductivity type.

10. A semiconductor device according to claim 9, wherein:
the thin surface region of each photodiode is further characterized by a pin voltage that is nearly equal to the predetermined fixed reference voltage; and
the doping concentration and a thickness of the charge collecting region of each photodiode are such that a charge capacity of the respective photodiode is maximal.

11. An X-ray medical imaging system comprising a semiconductor device according to claim 5.

12. A method of operating a semiconductor device comprising a CMOS image sensor with a plurality of active pixels arranged in rows and columns, each pixel comprising a photodiode, a reset transistor and a preset gate, the method comprising:
resetting a voltage on each photodiode to a predetermined fixed reference voltage at a beginning of a current read cycle;
transferring a predetermined preset charge from charge stored in the photodiode in each pixel into a well beneath a gate electrode of the respective preset gate during the resetting of the voltage on the photodiode in the current read cycle; and
transferring the predetermined preset charge from the well beneath the gate electrode into the photodiode after the rescuing of the photodiode voltage in the current read cycle.

13. A method according to claim 12, wherein the transferring of the predetermined preset charge into the well beneath the gate electrode of the respective preset gate includes defining a capacity of the well by a preset gate voltage applied to the gate electrode of the preset gate in each pixel during, the resetting of the voltage on the photodiode.

14. A semiconductor device comprising a CMOS image sensor with a plurality of active pixels arranged in rows and columns, each pixel comprising a photodiode, a reset transistor and a preset gate, the CMOS image sensor further comprising:
means for resetting a voltage on the photodiode in each pixel to a predetermined fixed reference voltage at a beginning of a current read cycle;
means for transferring a predetermined preset charge from charge stored in the photodiode in each pixel into a well beneath a gate electrode of the respective preset gate during the resetting of the voltage on the photodiode in the current read cycle; and
means for transferring the predetermined preset charge from the well beneath the gate electrode of the preset gate in each pixel into the respective photodiode after the resetting of the voltage on the photodiode in the current read cycle.

15. A semiconductor device according to claim 14, wherein:
a doping concentration of a charge collecting region of each photodiode defines a predetermined capacitance-voltage characteristic of the photodiode;
an integral of the predetermined capacitance-voltage characteristic from a start voltage to a finish voltage defines the predetermined preset charge in each pixel;
the start voltage is a voltage on the photodiode after the reset transistor is operated to reset the voltage on the photodiode in the current read cycle at which a capacitance of the photodiode is substantially zero; and
the finish voltage is a voltage on the photodiode slightly offset from the predetermined fixed reference voltage but at which the capacitance of the photodiode is non-zero and lies on the predetermined capacitance-voltage characteristic just before onset of a non-linearity region.

* * * * *